United States Patent [19]

Haney et al.

[11] 4,411,980

[45] Oct. 25, 1983

[54] PROCESS FOR THE PREPARATION OF FLEXIBLE CIRCUITS

[75] Inventors: Douglas M. Haney, Hockessin, Del.; John W. Lott, Tinton Falls, N.J.

[73] Assignee: E. I. Du Pont de Nemours and Company, Wilmington, Del.

[21] Appl. No.: 304,107

[22] Filed: Sep. 21, 1981

[51] Int. Cl.³ .............................................. G03C 5/24
[52] U.S. Cl. ................................... 430/291; 430/311; 430/328; 430/330; 430/319; 427/98
[58] Field of Search ............... 430/311, 291, 328, 330, 430/319; 427/96, 97, 98, 368, 369, 370; 228/178, 185, 223; 29/846

[56] References Cited

U.S. PATENT DOCUMENTS

| | | | |
|---|---|---|---|
| 3,060,024 | 10/1962 | Burg et al. | 430/291 |
| 3,347,724 | 10/1967 | Schneble, Jr. et al. | 156/151 |
| 3,637,385 | 1/1972 | Hayes et al. | 430/291 |
| 4,054,479 | 10/1977 | Peiffer | 156/280 |
| 4,066,851 | 1/1978 | White et al. | 200/5 A |
| 4,157,407 | 6/1979 | Peiffer | 427/98 |

FOREIGN PATENT DOCUMENTS 3363 3/1979 European Pat. Off. .

OTHER PUBLICATIONS

Research Disclosure No. 15882, Jun. 1977.

*Primary Examiner*—Won H. Louie, Jr.

[57] ABSTRACT

Process for the preparation of flexible circuits formed from flexible photohardenable elements having at least one organic elastomeric polymeric binder which comprises
(a) exposing imagewise said element,
(b) applying particulate conductive metal, e.g., nickel, copper, to the unexposed image areas, optionally
(c) heating the metal bearing areas, then
(d) removing excess metal particles, optionally
(e) fixing the particulate metal to the layer by heating, exposing to UV light or mechanical embedding, and
(f) plating electrolessly or soldering the metal containing areas. The process can be operated continuously to prepare single and double layer flexible printed circuits, membrane switches, etc.

17 Claims, 1 Drawing Figure

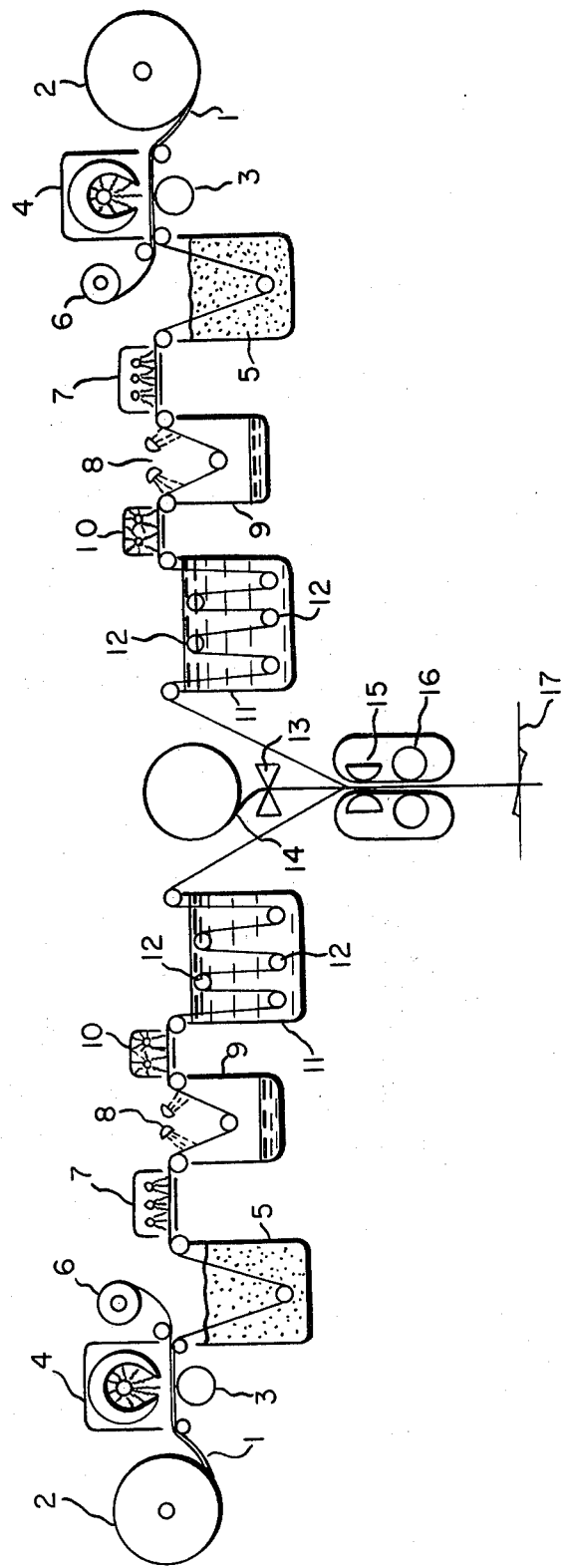

PROCESS FOR THE PREPARATION OF FLEXIBLE CIRCUITS

TECHNICAL FIELD

This invention relates to a process for the preparation of printed circuits including multilayer printed circuits. More particularly this invention relates to a process for the preparation of flexible printed circuits using flexible photohardenable elements.

BACKGROUND ART

The preparation of printed circuits, including multilayer printed circuits is known. Powdered materials such as particulate metals have been applied to surfaces having imagewise tacky and nontacky areas by a number of toning methods to produce printed circuit patterns. Representative methods are disclosed in U.S. Pat. Nos. 3,060,024; 3,649,268; 4,054,479, 4,054,483, 4,157,407 and 4,234,626. After the particulate metal is applied to the tacky image areas and unwanted particles are removed, e.g., mechanically, from the nontacky image areas, the circuit is formed by one of several additive techniques including fusion of metal particles, electroless plating, electroplating, etc. The printed circuits formed by these additive processes are useful, but the processes have certain disadvantages. While the printed circuits may possess some flexibility, it is necessary in the preparation of some products, e.g., electronic switches, etc. to provide highly flexible printed circuits which are capable of being bent continuously over a small radius. Electronic switches can be prepared by screen printing the circuitry onto flexible film supports by means of electrically conductive ink. Such printing must be done uniformly in the correct position for each circuit and then dried properly. The process requires skillful printers and special printing equipment and dryers. The types of inks used for preparing electronic switches do not always dry uniformly to give reproducible conductivity and the adhesion of the ink to its substrate is sometimes insufficient.

An object of this invention is to provide a process, including a continuous process, whereby flexible printed circuits can be prepared by additive procedures such as electroless plating and soldering, using flexible photohardenable elements which are capable of being bent over a small radius; the photohardenable composition being capable of surviving the plating and soldering and providing reliable conductivity and adhesion. Another object of this invention is to provide a process for the preparation of electronic or membrane switches using flexible photohardenable elements and additive techniques for the formation of the circuits.

BRIEF DESCRIPTION OF DRAWING

In the accompanying drawing forming a material part of this disclosure the FIGURE is an elevation with parts in section showing the various parts of an automated apparatus for practicing this invention wherein two flexible printed circuits are prepared, placed in register face to face and laminated to each other.

DISCLOSURE OF INVENTION

In accordance with this invention there is provided a process for the preparation of flexible circuits formed from a flexible photohardenable element which comprises:

(a) exposing imagewise to actinic radiation the flexible photohardenable element comprising, in order,
(1) a flexible support,
(2) a dry, tacky photohardenable layer comprising a photohardenable composition, optionally including at least one organic elastomeric polymeric binder compound, and, optionally,
(3) a removable cover sheet;
(b) removing the cover sheet, if present, and applying particulate metal to the unexposed image areas of the photohardenable layer; optionally
(c) heating the element to a temperature in the range of 25° to 80° C.; then
(d) removing excess particulate metal; optionally,
(e) fixing or binding the particulate metal to the photohardenable layer by heating, curing by exposing to actinic radiation, embedding mechanically and combinations thereof; and
(f) plating electrolessly or soldering the particulate metal bearing or metal containing areas thereby forming an electrically conductive circuit.

Referring to the drawing the FIGURE shows the basic steps of an embodiment of the invention wherein flexible circuits are formed from a flexible photohardenable element which comprises, in order,
(1) a flexible support,
(2) a dry, tacky photohardenable layer comprising a photopolymerizable, photocrosslinkable or photodimerizable composition including at least one organic elastomeric polymeric binder compound and a photoinitiator or photoinitiator system, and, optionally but preferably,
(3) a removable cover sheet.

Alternatively an overcoat layer, e.g., polyvinyl alcohol, etc. can be present over the photohardenable layer in place of the cover sheet. The overcoat layer is removed by aqueous washout.

The term "flexible circuit" as used herein means a circuit wherein a 0.001 inch (0.025 mm) thick layer laminate consisting of photohardened material and circuit material can be repeatedly bent around a structure having a diameter of 0.6 inch (15.24 mm) or less and preferably 0.375 inch (9.53 mm) without breaking, cracking or delaminating. For circuits having layer laminates with thicknesses different from 0.001 inch (0.025 mm), the above structure diameter criteria would be increased or decreased proportionately with the proviso that the minimum diameter of the structure would always be greater than 0.25 inch (6.35 mm). Thus for a circuit layer laminate of 0.010 inch (0.254 mm) the structure would have a diameter of 6 inches (15.24 cm) or less and preferably 3.75 inches (9.53 cm). It is understood that the flexible support should have flexibility at least comparable to the layer laminate. The terms "photohardenable" and "photopolymerizable" as used herein refer to systems in which the molecular weight of at least one component of the photosensitive material is increased by exposure to actinic radiation sufficiently to result in a change in the rheological and thermal behavior of the exposed areas. Photocrosslinkable and photodimerizable compositions are included in the definition of photohardenable.

A flexible, photohardenable element 1 as described above having a removable cover sheet is continuously unwound from a storage roll 2 and is supported by means of a roll 3 as it passes a source of actinic radiation 4 whereby the element is imagewise exposed. The exposed element passes from the exposure source into a source of particulate metal 5, the cover sheet preferably present, is removed on a take up roll 6 prior to entering the particulate metal source 5. The particulate metal adheres to the tacky nonexposed image areas of the photohardened element. From source 5 the metallized element moves past a heater 7, e.g., infrared heater, which heat sets the metal bearing or metal containing areas. The excess metal particles adhering to areas of the element other than the tacky image areas are then removed by passing the heat set element through a water impingement cleaning device 8 which has container 9 to contain the water spray. Brushes or other removal means may be present to help remove the excess toner. The element is moved past an actinic radiation exposure source 10 which cures the photohardenable layer thereby fixing the particulate metal to the layer. A conductive circuit is formed on the metal-bearing areas of the element by passing the element into an electroless plating bath 11. The element passes through the plating bath over a series of rolls 12 which enable the element to remain in the bath for a sufficient time period, e.g., 1 to 6 hours, preferably 1 to 2 hours, to provide a conductive circuit of the desired thickness range, e.g., about 0.00025 to 0.001 inch (0.006 to 0.025 mm) in thickness. In the FIGURE, two photohardenable elements undergo simultaneous treatments as described above. After the electroless plating, an adhesive layer from adhesive source 13 is applied to both sides of a dielectric spacer 14 with openings in the switch areas, and the two circuits and spacer are placed in register by register means 15 and are laminated front to front by means of a heat pressure source 16. The laminate can then be cut to size, e.g., by a die 17. Subsequently connectors can be applied to connect the circuits and after testing for circuit reliability the printed circuit can be packaged. It is understood that for many applications only a single conductive circuit is applied to a flexible support thus the duplicate apparatus and dielectric spacer are not required. A single flexible conductive circuit can also be adhered, e.g., laminated to a backing sheet, e.g., a rigid substrate or surface, e.g., a circuit board.

The flexible photohardenable elements as described above are critical to the operation of the process of this invention. A flexible layer of a photohardenable composition is formed on a flexible support. Preferably a flexible cover sheet is applied to protect the tacky surface of the photohardenable layer, e.g., during storage. The cover sheet is not absolutely necessary, however.

The type of photohardenable composition used is extremely important since in layer form the surface must be tacky and receptive to particulate metal and must be able to withstand the rigors of the other process steps including the electroless plating or soldering as well as any heating and curing steps. In addition, it is critical that the flexibility of the layer not be affected by the process of preparing the flexible circuit. Useful photohardenable compositions include photopolymerizable compositions capable of addition polymerization which are preferred, as well as photocrosslinkable and photodimerizable compositions. Photopolymerizable compositions generally contain at least one of the below-listed monomers, preferably addition polymerizable ethylenically unsaturated compounds having at least two terminal ethylenic groups, free radical generating addition polymerization initiators or initiator systems activatable by actinic radiation and at least one organic elastomeric polymeric binder present in a predominant amount. Other components noted below can also be present in the compositions. The monomer is present in 10 to 35 parts by weight, preferably 15 to 25 parts by weight; the initiator is present in 1 to 8 parts by weight, preferably 3 to 5 parts by weight; and the elastomeric binder in 85 to 50 parts by weight, all based on the total weight of the composition. In layer form the composition is preferably 0.0005 to 0.006 inch (0.013 to 0.152 mm) in thickness.

Monomers: t-butyl acrylate, 1,5-pentanediol diacrylate, N,n-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, trimethylolpropane triacrylate, pentaerythritol triacrylate, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di(p-hydroxyphenyl)-propane dimethacrylate, di-(3-methacryloxy-2-hydroxypropyl) ether of Bisphenol-A, di-(2-methacryloxyethyl) ether of Bisphenol-A, di-(3-acryloxy-2-hydroxypropyl) ether of Bisphenol-A, di-(2-acryloxyethyl) ether of Bisphenol-A, di-(3-methacryloxy-2-hydroxypropyl) ether of tetrachloro-Bisphenol-A, di-(2-methacryloxyethyl) ether of tetrachloro-Bisphenol-A, di-(3-methacryloxy-2-hydroxypropyl) ether of tetrabromo-Bisphenol-A, di-(2-methacryloxyethyl) ether of tetrabromo-Bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the photohardenable layer can also contain at least one of the following free-radical initiated, chain-propagating, addition polymerizable, ethylenically unsaturated compounds having a molecular weight of at least 300. These monomers include, preferably, an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, which is incorporated by reference, e.g., those having a plurality of addition polymerizable ethylenic linkages, particularly when present as terminal linkages, and especially those wherein at least one and preferably most of such linkages are conjugated with a double bonded carbon, including carbon doubly bonded to carbon and to such hetero atoms as nitrogen, oxygen and sulfur. Outstanding are such materials wherein the ethylenically unsaturated groups, especially the vinylidene groups, are conjugated with ester or amide structures.

Initiators: substituted or unsubstituted polynuclear guinones which are compounds having two intracyclic carbon atoms in a conjugated carbocyclic ring system.

Suitable such initiators include 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloroanaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz(a) anthracene-7,12-dione. Other photoinitiators which are also useful, even though some may be thermally active at temperatures as low as 85° C., are described in Plambeck U.S. Pat. No. 2,760,863 and include vincinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc; α-hydrocarbon substituted aromatic acyloins, including α-methylbenzoin, α-allylbenzoin and α-phenylbenzoin. In addition the photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes may be used. Other suitable polymerization initiators are Michler's Ketone, benzophenone 2,4,5-triphenylimidazolyl dimers with hydrogen doners, and mixtures thereof as described in U.S. Pat. Nos. 3,427,161; 3,479,185 and 3,549,367.

All the aforementioned U.S. patents are incorporated by reference.

Elastomeric Binders: synthetic rubbers, e.g., butadiene/acrylonitrile, acrylonitrile/butadiene (carboxy-modified, e.g., 3%) acrylonitrile/butadiene/styrene, alkyl (1 to 4 carbon atoms) methacrylate/acrylonitrile/butadiene, alkyl (1 to 4 carbon atoms) methacrylate/styrene/acrylonitrile/butadiene interpolymers, 2-chlorobutadiene/1,3-polymers, chlorinated rubber, styrene/butadiene/styrene, styrene/isoprene/styrene block copolymers and other block copolymers described by Holden et al. in U.S. Pat. No. 3,265,765 which is incorporated by reference, n-butyl methacrylate, polyether polyurethane resin, etc. The elastomeric binders can be used individually or in combination with minor amounts of nonelastomeric binders, e.g., polyacrylate and alpha-alkyl polyacrylate esters, e.g., polymethyl methacrylate and polyethylmethacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrenes; vinylidene chloride copolymers, e.g., vinylidene chloride/acrylonitrile, vinylidene chloride/methacrylate and vinylidene chloride/vinyl acetate copolymers; polyvinyl chloride and copolymers, e.g., polyvinyl chloride/acetate; high molecular weight polyethylene oxides of polyglycols having average molecular weights of 4000 to 1,000,000; epoxides; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic acid isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose, polycarbonates; polyvinyl acetal, e.g., polyvinyl butyral, polyvinyl formal; polyformaldehydes.

Other optional additives include: inhibitors, dyes, pigments, plasticizers, etc.

Suitable thermal polymerization inhibitors include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitroso dimers, e.g., 1,4,4-tri-methyl-2,3,-diazobicyclo[3.2.2]- non-2-ene-2,3-dioxide, dinitrobenzene, p-toluquinone and chloranil.

Various dyes may be added to increase the visibility of the image formed. Pigments may also be used in this capacity. Any colorant used, however, should preferably be transparent to the actinic radiation used.

Useful plasticizers may be the monomer itself, e.g., a diacrylate ester, or any of the common plasticizers which are compatible with the polymeric binder, e.g., dialkyl phthalate, polyethylene glycol, and alkyl phosphates.

Suitable flexible supports which bear the photohardenable layer include: polyethylene terephthalate, flame-treated polyethylene terephthalate (preferred), electrostatic discharge treated polyethylene terephthalate, polyimides, polyolefines, e.g., polypropylene; polyparabanic acid, etc.

Suitable removable cover sheets that may be present are: silicone treated polypropylene (preferred), polyethylene, polyethylene terephthalate, etc.

The element in roll form, e.g., wound around a storage roll, is utilized in the process shown in the FIGURE and is necessary for the continuous process embodiment. The element can be present and processed in individual steps, however, but this is less preferred since the operation would be lengthy and more expensive. The more detailed description of the process that follows will be exemplified by the use of the element in roll form in a continuous process.

The photohardenable element is unwound from the roll and moved by means of a roll or other drive means to an exposure source, i.e., an actinic radiation source, whereby the element is exposed imagewise and tacky (adherent) image or images are defined. Suitable radiation sources depend on the photohardenable composition type. Generally, however, radiation sources that are rich in ultraviolet radiation are useful. Radiation sources are disclosed in U.S. Pat. Nos. 2,760,863; 3,649,268; and 4,157,407, the disclosures of which are incorporated by reference. The exposure may be through a phototool, negative or positive, having the circuit image including circuit trace. Special phototools may have to be used for particular needs such as crossovers or the formation of circuits useful in multilayer circuits.

Ductile metal and alloy particles, plating catalyst particles, or combinations thereof are applied to the imagewise exposed element. The particles adhere primarily to the tacky nonexposed image areas. Suitable particles which can be electrolessly plated or soldered include: copper (preferred), nickel, tin, lead, solder, mixtures of copper and solder, copper-tin alloy, tin-lead alloy, aluminum, gold, silver, metal oxides such as titanium oxide, copper oxide, etc. The particles have an average diameter of about 0.1 to 250 μm, preferably 1 to 10 μm. Mixed particle sizes can be used.

The particles can be applied to the tacky (unexposed) image areas in known manner. A preferred application method is by use of a fluidized bed of particles, such as described in Research Disclosure, June 1977, No. 15882 by Peiffer and Woodruff which is incorporated by reference. Other application or toning means for the particulate metals are described in U.S. Pat. Nos. 3,060,024; 3,391,455; 3,506,483; 3,637,385; 3,649,268; and 4,019,821, all of which are incorporated by reference. It is preferred that the particulate metal is applied to the unexposed areas by imbedding the metal into the surface.

To improve the retention of the metal particles in the tacky image areas preferably the photohardenable layer of the element is heat set by passing it under or through a heating unit. A type of unit is an infrared heater such as a Cal Ray ® model by General Electric Co., Schenectady, N.Y. The element is maintained in the presence of the heater for about 0.1 to 5 minutes.

It is important that any excess metal or alloy particles be removed from the nontacky image areas. Suitable mechanical and other means for removing excess particles are described in the above-mentioned Research Disclosure. Preferably a water wash, e.g., by impingement jet, is used with gentle mechanical scrubbing. Air impingement devices are also useful as well as wiping means although care must be taken not to remove metal particles in the tacky image areas. The removal of excess particles occurs subsequent to the heat setting if this step is used.

Again it is preferred that adhesion of the particulate metal to the photohardened elements be improved. The particulate metal can be fixed or bound to the photohardened layer by heating, e.g., in the temperature range of 80° to 150° C. for at least 10 seconds, the temperature being below the degradation temperature of the photohardened element; cured by exposure to actinic radiation, e.g., by means of an actinic radiation source as described above, or mechanical embedding, e.g., passing the toned circuit through the nips of mechanical rollers. Combinations of these means also can be used. The preferred fixing means is by exposure to actinic radiation as shown in the drawing. Generally this exposure time is in the range of 0.5 to 10 minutes.

Electroless plating procedures are known to those skilled in the art, e.g., U.S. Pat. No. 4,054,483 which is incorporated by reference. Electroless plating baths are commercially available, e.g., from the Shipley Company, Revere, MA, Kollmorgen Corp., Glen Cove, N.Y., and other sources. Such baths may have to be modified to insure that the metal-bearing flexible element is maintained in the bath for a sufficient period of time, e.g., 1 to 6 hours, preferably 1 to 2 hours. Useful electroless plating solutions are described in the examples below, Zeblisky et al. U.S. Pat. No. 3,095,309, particularly Example II, which is incorporated by reference. The temperature of the electroless platinb bath can range from 43° to 65° C., preferably 50° C.

The circuit can also be formed by soldering techniques as known to those skilled in the art, e.g., Cohen and Peiffer, Published European Application No. 0 003 363, published Mar. 8, 1979 which is incorporated by reference. Prior to soldering, the metallized areas are treated by known procedures with solder fluxes typified by the following compositions:

Rosin type, organic, e.g., a mixture of diterpene acids in alcohol, water, or other appropriate solvent;
Inorganic acids, e.g., HCl, orthophosphoric acid, etc.;
Inorganic salts, e.g., zinc chloride, ammonium chloride and combinations thereof used to produce HCl upon heating in the presence of water;
Organic acids, e.g., lactic, citric, oleic, etc.;
Organic halogen compounds, e.g., aniline hydrochloride, etc.;
Organic amines and amides, e.g., urea, etc.

These fluxes can contain curing or hardening catalysts or reagents.

The fluxed image areas are subsequently exposed to molten solder, e.g., solder waves, etc. Known solder compositions can be used, e.g., tin, lead combinations, and compositions containing bismuth, cadmium, indium, silver and antimony. When the adherent material is thermally stable, low melting metals alone may be used, e.g., tin, lead, indium, etc. Preferred solders particularly useful in the preparation of printed circuits are tin/lead in ratios of 63/37 and 60/40. It is important to balance the ability to solder with the adhesion of the metal particles in the adherent image areas, e.g., the areas should be tacky enough to adhere the metal particles but not too tacky whereby the particles would become coated or engulfed with the tacky material.

Once a conductive circuit has been formed as described above the circuit can be electroplated by standard electroplating procedures to increase the thickness of the circuit.

Two flexible circuits prepared as described above prepared either separately or simultaneously (as shown in the Figure) can be used in conjunction with one another to form circuits. One useful form is a membrane switch wherein the flexible circuits are placed in register face to face and are adhesively joined together, e.g., by lamination at elevated temperature, separated by a perforated dielectric layer which allows contact at desired points when mechanical pressure is applied to one side of the circuit. A membrane switch can also be prepared from a single flexible circuit as follows: (1) folding 180° the electrically conductive circuit having first and second sections having contactors and contacts, respectively, whereby the contactors and contacts are adjacent to each other, and (2) inserting between said folded conductive circuit a dielectric spacer having a plurality of openings therethrough for selective alignment with the contacts and contactors.

Flexible multilayer circuits with conductive interconnectors can be prepared in the manner generally described in Example 8 below using a flexible substrate and a layer or layers of the flexible photohardenable composition as described in this invention. Additional information about the preparation of multilayer circuits with conductive interconnections is found in U.S. Pat. No. 4,157,407, which is incorporated by reference.

BEST MODE FOR CARRYING OUT THE INVENTION

The best mode for electroless plating is illustrated in Examples 1 and 2, the latter for an automated procedure. Example 6 illustrates the best mode for soldering to form the flexible circuit.

INDUSTRIAL APPLICABILITY

The process of this invention is easily adapted to automation and is applicable to the preparation of fine conductive wiring traces and low cost flexible printed circuits including multilayer printed circuits. The printed circuits obtained by the process can be laminated to a rigid backing material for use as a rigid membrane switch. A flexible circuit can be laminated to a ground plane or to a rigid circuit to form a multilayer circuit board. A preferred use for the flexible printed circuit is in the preparation of membrane switches where flexure is needed to provide mechanical ability to open and close contacts. Such switches are formed as described in the Figure by applying two formed circuits in register to a suitable dielectric sheet or film having holes corresponding to the switch contacts. Alternatively, the switches can be formed by folding the formed circuit in register and inserting a suitably sized dielectric sheet or film between the fold. The membrane switch is useful as a telephone keyboard, in electrical appliances, electrical toys, calculators, or other objects which require a magnitude of depressions, e.g., millions, throughout their useful lives.

EXAMPLES

The following examples illustrate the invention wherein the parts and percentages are by weight. In Examples 1 to 5 membrane switches are prepared using flexible photoadhesive layers on a flexible substrate and electroless plating.

EXAMPLE 1

A methylene chloride solution (82%) of a tacky photopolymer composition is coated on each of two flame-treated polyethylene terephthalate films, 0.005 inch (0.127 mm) thick, and is dried [0.0016 inch (0.041 mm)]. The photopolymer composition is prepared from the following ingredients:

| Ingredient | Amount (Parts) |
| --- | --- |
| Rubber [3% carboxy-modified acrylonitrile(27)/butadiene(73)], high molecular weight, average Mooney viscosity is 45 | 58.0 |
| Methyl methacrylate(34)/styrene(42)/acrylonitrile(8)/butadiene(16) interpolymer | 12.5 |
| Trimethylolpropane triacrylate | 25.0 |
| Benzophenone | 4.0 |
| 4,4-Bis(dimethylamino)benzophenone | 0.5 |
| 1,4,4-trimethyl-2,3,-diazobicyclo-[3.2.2]non-2-ene-2,3,-dioxide | 0.05 |

A silicone release coated polyethylene terephthalate film cover sheet, 0.001 inch (0.0254 mm) thick, is laminated to the dry photopolymer layer giving flexible support-photopolymer layer-cover sheet sandwichs (elements).

A positive transparency of a membrane switch circuit (phototool) is placed in contact with the cover sheet side of the element, and the element is imagewise exposed for 30 units with a 5 Kw actinic radiation source using a Riston® PC 24 Printer, E. I. du Pont de Nemours and Company, Wilmington, DE. The cover sheet and phototool are removed, and the element is toned in a fluid bed toner with 8 μm copper powder, Alcan® MD-301. Copper powder adheres to the unexposed areas. The toned circuit is heated for 3 minutes in a 150° C. oven to heat set the toned areas. Excess copper powder is removed with water and mild abrasion. The metallized element is cured by exposing to ultraviolet radiation in an Argus ultraviolet processor model PC7100 for 15 seconds. The toned circuit is then plated in a Shipley electroless copper plating bath, Cuposit®CP-74, Shipley Co., Revere, MA. for one hour at 50° C. After plating, the circuit elements are registered and with a hole punched dielectric separation sheet are assembled as a membrane switch.

The resulting membrane switch has a resistance of less than 2 ohms in the closed position. The switch is repeatedly wrapped around a dowel, 0.375 inch (about 9.53 mm) in diameter without showing physical or electrical damage. The circuit elements are firmly attached to the polyethylene terephthalate substrate and cannot be removed by applying Scotch® Magic Mending Tape and stripping the tape.

EXAMPLE 2

This example illustrates the preparation of a membrane switch in an automated production facility.

A roll of the photopolymer element as described in Example 1 is attached to a polyethylene terephthalate film 0.005 inch (0.127 mm) in thickness that is threaded the entire length of the production line. Positive image-bearing phototools of the switch pattern are placed on the cover sheet of the element as it is drawn at 6 inches/minute (15.24 cm/min.) under an Oriel® collimated light source. The exposure time is 20 seconds at 6.5 milliwatts/cm$^2$. After exposure the phototool and element cover sheet are removed automatically and the exposed element is driven over rollers through a fluid bed toner apparatus (Research Disclosure No. 15882, Peiffer and Woodruff, June 1977) containing about 8 μm copper particles for about 30 seconds. The toned element is transported under two infrared heaters and is heated to a temperature of about 85° C. which heat sets the toned areas. The heat set element is then driven past a cleaning unit where it is spray-washed with water and gently abraded with counter-rotating pads. The toned element then passes under a source of actinic radiation where it is exposed for one minute at 7.8 mw/cm$^2$ to cure the photopolymer layer and to firmly anchor the copper particles. Optionally air can be excluded to improve the curing step. The cured element continues into an aqueous solution of ammonium persulfate (10%) for one minute and is rinsed with water for one minute. The element transport speed is slowed to 1.5 inches/minute (3.81 cm/min.) as it travels through an electroless copper plating solution (Add Plate® 480, PCK Technology Division of Kollmorgen Corp., Glen Cove, N.Y. for one hour. The plating solution is maintained at 53° C. in a J. Holland and Sons, Inc. laboratory electroless copper plating module. As the plated circuit element emerges from the plating bath, it is rinsed in water, dried and wound up on a rewind mandrel. Other circuits follow as the sequence is repeated. The circuit pattern is then cut, is assembled as a membrane switch, and is tested. The switch has the same properties as the switch prepared as described in Example 1.

EXAMPLE 3

Example 1 is repeated except that the photopolymer layer having a dry thickness of 0.0009 inch (0.0229 mm) is prepared from the following ingredients:

| Ingredient | Amount (Parts) |
| --- | --- |
| Polyether polyurethane resin[1] | 69.0 |
| Trimethylolpropane triacrylate | 25.0 |
| 4,4'-Dichlorobenzophenone | 5.5 |

-continued

| Ingredient | Amount (Parts) |
|---|---|
| 4,4'-Bis(dimethylamino)benzophenone | 0.5 |

[1]The polyether polyurethane resin, Q-than ® P250-2, a product of K. J. Quinn Co., Malden, MA, is a crystalline, thermoplastic resin having a Brookfield viscosity of 600 to 1200 centipoises using 15% solids in methyl ethyl ketone and a Brookfield spindle #3 at 12 rpm and an adhesive activation temperature of about 63° C., and a decrystallization temperature of about 49° C.

The resulting membrane switch has a resistance of less than 2 ohms in the closed position and is wound around a dowel, 0.375 inch (about 9.53 mm) in diameter without damage. The anchorage is satisfactory as shown by the tape test described in Example 1.

EXAMPLE 4

Example 1 is repeated except that the photopolymer layer having a dry thickness of 0.0007 inch (0.0178 mm) is prepared from the following ingredients:

| Ingredient | Amount (Parts) |
|---|---|
| Interpolymer described in Example 1 | 64.0 |
| Trimethylolpropane triacrylate | 29.0 |
| 4,4'-Dichlorobenzophenone | 6.4 |
| 4,4'-Bis(dimethylamino)benzophenone | 0.6 |

The resulting membrane switch has a resistance of less than 2 ohms in the closed position. No electrical or physical damage is noted when the switch is wrapped around a dowel as described in the previous examples. The anchorage is good as shown by the tape test described in Example 1.

EXAMPLE 5

Example 1 is repeated except that the photopolymer layer having a dry thickness of 0.0007 inch (0.0178 mm) is prepared from the following ingredients:

| Ingredient | Amount (Parts) |
|---|---|
| n-Butylmethacrylate polymer, inherent viscosity of 0.25 g polymer in 50 ml $CH_2Cl_2$ measured at 20° C. using a No. 50 Cannon-Fenske Viscometer is 0.5 | 68.4 |
| Trimethylolpropane triacrylate | 21.4 |
| Tris(4-diethylamino-o-tolyl) methane | 5.1 |
| 4,4'-Dichlorobenzophenone | 4.7 |
| 4,4'-Bis(dimethylamino)benzophenone | 0.4 |

The resulting membrane switch has a resistance of less than 2 ohms in the closed position. No electrical or physical damage is noted when the switch is wrapped around a dowel as described in Examples 1 and 3. The anchorage is good as shown by the tape test described in Example 1.

EXAMPLE 6

A layer of a photopolymer composition prepared as described in Example 1, 0.0011 inch (0.028 mm) in thickness supported on a 0.002 inch (0.051 mm) polyimide film and bearing a 0.003 inch (0.076 mm) silicone release layer coated polypropylene cover sheet is exposed to a positive circuit pattern for 15 seconds on an ultraviolet exposure source, a 400 watt, medium pressure, mercury vapor lamp on a Model DM VL-HP Double Sided Exposure Frame, manufactured by Colight, Inc., Minneapolis, Minn. The cover sheet is removed and the flexible exposed element is dipped into a fluid bed toner containing 8 μm copper powder. The exposed element is fastened temporarily for support to a rigid sheet of glass epoxy board commonly used in the printed circuit industry, and the element is heated in an oven at 150° C. for 50 seconds. After removal from the oven and cooling to room temperature, excess copper powder is removed with a water spray. The element is dried and is conveyed twice through an Argus ultraviolet processor model PC7100 at 10 feet/minute (3.048 m/min.). An aqueous solder flux, Alpha ® 709F manufactured by Alpha Metals, Inc., Jersey City, N.J., is brushed on the metal-toned areas, and the fluxed element is conveyed at 6 feet/minute (1.83 m/min.) through a wave-solder machine manufactured by Hollis Engineering, Inc., Nashua, N.H. The toned circuit areas become covered with solder (tin/lead (60/40)). The resistance of a 7 inch (17.78 cm) long 0.040 inch (1.02 mm) wide line is about 0.2 ohm. After removal of the support film, the circuit is repeatedly wrapped around a dowel, 1.5 inches (about 3.81 cm) in diameter without showing physical or electrical damage. The circuit is firmly attached to the polyimide support and is not removed by the tape test described in Example 1.

EXAMPLE 7

A photopolymer element as described in Example 6 without the cover sheet is exposed for 30 seconds to a positive of a printed circuit trace by means of the exposure device described in Example 6. The flexible exposed element is dipped into a fluid bed toner containing 8 μm copper powder. The element is heated in an oven at 120° C. for 2 minutes, is cooled to room temperature and is cleaned of excess particulate copper by means of a water spray. The element is then dried and is cured by passing through the actinic radiation source as described in Example 6. The toned circuit trace is plated in a Shipley electroless copper plating bath, Shipley Co., Revere, MA, for 6 hours at 50° C. The plated element is heated in an oven at 150° C. for 60 minutes and immediately the solder flux described in Example 6 is applied to the conductive copper traces followed by passing the fluxed element through the wave-solder machine as described in Example 6. The resistance of the circuit trace is 0.2 ohm. The circuit is flexible and is firmly attached to the support after being tested as described in Example 1.

EXAMPLE 8

This example illustrates the preparation of flexible multilayer circuits.

A flexible circuit is prepared as described in Example 1. A layer of a similar flexible photopolymer composition, 0.002 inch (0.51 mm) is laminated to the flexible circuit. The laminated element is exposed as described in Example 1 using a phototool which leaves only the areas unexposed where circuit lines or "cross-over" lines are required. The element is toned in a fluid bed toner containing 8 μm copper powder, and the toned circuit is heated for 2 minutes in an oven at about 150° C. Excess copper powder is removed as described in Example 1 and the laminate is dried. The laminate is exposed a second time to the same exposure source whereby all areas containing toner are polymerized with the exception of the areas where interconnecting pathways are required between the circuit lines on the initial circuit and the "cross-over" lines on the second flexible photopolymer layer. The areas left unpolymerized are masked by a second phototool defining interconnections. The interconnecting unpolymerized areas are washed out using methylchloroform. Additionally if contactors are located on the initial circuit the corresponding areas of the second photopolymer layer are washed out with the solvent. The interconnections obtained are toned with copper powder as described previously above, the laminate is then baked in an oven at 150° C. for 2 minutes, the excess copper powder is removed as described above, and is cured by exposing to ultraviolet radiation in an Argus ultraviolet processor model PC7100 for 15 seconds. The toned circuit is electrolessly plated as described in Example 1 forming a flexible multilayer circuit.

CONTROL 1

Example 1 is repeated except that the tacky photohardenable layer having a dry thickness of 0.002 inch (0.051 mm) is prepared from the following ingredients:

| Ingredient | Amount (Parts) |
| --- | --- |
| Interpolymer described in Example 1 | 25.4 |
| Methylmethacrylate (96%)/ethyl-methacrylate(4%)copolymer, inherent viscosity of 0.25 g polymer in 50 ml CH2Cl2 measured at 20° C. using a No. 50 Cannon-Fenske Viscometer is 0.5 | 7.9 |
| Pentaerythritol triacrylate | 19.3 |
| Di-(3-acryloxy-2-hydroxypropyl) ether of bisphenol-A | 19.3 |
| 4,4'-Dichlorobenzophenone | 4.6 |
| 4,4'-Bis(dimethylamino)benzophenone | 0.4 |
| Monastral Green ® (pigment 30%) roll-mill blended with the interpolymer described in Example 1 | 0.1 |
| Polyethylene covered talc, 5-μm | 23.0 |

The resulting membrane switch while having a resistance of less than 2 ohms cannot be effectively wrapped around a dowel as described in Example 1. The photohardenable layer cracks and the adhesion to the polyethylene terephthalate film fails.

CONTROL 2

Control 1 is repeated except that the tacky photohardenable layer has a dry thickness of 0.0011 inch (0.028 mm) is prepared from the following ingredients:

| Ingredient | Amount (Parts) |
| --- | --- |
| Polyester prepared by reacting 1.0 mole ethylene glycol, 0.5 mole azelaic acid, 0.17 mole isophthalic acid, and 0.33 mole terephthalic acid, the no. average mol. wt. is about 19,000 and the wt. average mol. wt. is about 37,000 | 69.0 |
| Trimethylolpropane triacrylate | 25.0 |
| 4,4'-Dichlorobenzophenone | 5.5 |
| 4,4'-Bis(dimethylamino)benzophenone | 0.5 |

The resulting membrane switch has a resistance greater than 10,000 ohms. The plating bath blisters the conductive circuit giving poor anchorage to the flexible support.

We claim:

1. A process for the preparation of flexible circuits formed from a flexible photohardenable element which comprises:
    (a) exposing imagewise to actinic radiation the flexible photohardenable element comprising, in order,
        (1) a flexible support,
        (2) a dry, tacky photohardenable layer comprising a photohardenable composition, including at least one organic elastomeric polymeric binder compound, and, optionally,
        (3) a removable cover sheet;
    (b) removing the cover sheet, if present, and applying particulate metal to the unexposed image areas of the photohardenable layer; optionally
    (c) heating the element to a temperature in the range of 25° C. to 80° C.; then
    (d) removing excess particulate metal; optionally,
    (e) fixing or binding the particulate metal to the photohardenable layer by heating, curing by exposing to actinic radiation, embedding mechanically, and combinations thereof; and
    (f) plating electrolessly or soldering the particulate metal bearing or metal containing areas thereby forming an electrically conductive flexible circuit, said electrically conductive flexible circuit when having a thickness of 0.001" can be repeatedly bent around a structure having a diameter of 0.600" without breaking, cracking or delaminating, said electrically conductive flexible circuit when having thicknesses different from 0.001" the diameter of said structure would be increased or decreased proportionally with the proviso that the minimum diameter of said structure would always be greater than 0.25".

2. A process according to claim 1 wherein the photohardenable layer comprises (i) an addition polymerizable ethylenically unsaturated compound having at least two terminal ethylenic groups, (ii) at least one organic elastomeric polymeric binder compound, and (iii) a free radical generating addition polymerization initiator or initiator system activatable by actinic radiation.

3. A process according to claim 1 or claim 2 wherein the binder is a combination of methylmethacrylate/styrene/acrylonitrile/butadiene interpolymer and a carboxylated acrylonitrile/butadiene rubber compound.

4. A process according to claim 1 or claim 2 wherein the binder is a methylmethacrylate/styrene/acrylonitrile/butadiene interpolymer.

5. A process according to claim 1 or claim 2 wherein the binder is a polymer of n-butylmethacrylate.

6. A process according to claim 1 or claim 2 wherein the binder is a polyether polyurethane polymer.

7. A process according to claim 1 wherein the steps of the process are performed continuously.

8. A process according to claim 1 wherein the flexible electrically conductive circuit is adhered to a backing sheet.

9. A process according to claim 8 wherein the backing sheet is a rigid substrate or surface.

10. A process according to claim 1 wherein the particulate metal is copper.

11. A process according to claim 1 wherein the particulate metal is nickel.

12. A process according to claim 1 wherein the particulate metal is applied to the unexposed areas by embedding the metal into the surface.

13. A process according to claim 1 wherein the excess particulate metal is removed by impingement with water.

14. A process according to claim 1 wherein the excess particulate metal is removed by air impingement.

15. A process according to claim 1 wherein the particulate metal is fixed or bound to the photohardened layer by heating in the temperature range of 80° to 150° C., for at least 10 seconds, the temperature being below the degradation temperature of the photohardened element.

16. A process according to claim 1 wherein the particulate metal bearing areas are plated electrolessly.

17. A process according to claim 1 wherein the particulate metal bearing areas are soldered.

* * * * *